United States Patent
Ranganath et al.

(10) Patent No.: US 6,836,854 B2
(45) Date of Patent: Dec. 28, 2004

(54) DS3 DESYNCHRONIZER WITH A MODULE FOR PROVIDING UNIFORMLY GAPPED DATA SIGNAL TO A PLL MODULE FOR PROVIDING A SMOOTH OUTPUT DATA SIGNAL

(75) Inventors: Balaji Ranganath, North Andover, MA (US); Jahangir Nakra, Bradford, MA (US)

(73) Assignee: Applied Micro Circuits Corporation, Andover, MA (US)

( * ) Notice: Subject to any disclaimer, the term of this patent is extended or adjusted under 35 U.S.C. 154(b) by 619 days.

(21) Appl. No.: 09/825,102

(22) Filed: Apr. 3, 2001

(65) Prior Publication Data

US 2002/0144169 A1 Oct. 3, 2002

(51) Int. Cl.$^7$ ............................. G06F 1/12
(52) U.S. Cl. ............ 713/503; 370/505; 370/516
(58) Field of Search ................ 370/505, 516; 713/503

(56) References Cited

U.S. PATENT DOCUMENTS 5,268,936 A * 12/1993 Bernardy ............... 375/372
5,548,534 A * 8/1996 Upp ..................... 370/504

* cited by examiner

Primary Examiner—Thomas Lee
Assistant Examiner—Tse Chen
(74) Attorney, Agent, or Firm—Weingarten, Schurgin, Gagnebin & Lebovici LLP (57) ABSTRACT

A desynchronizer for smoothing gapped data signal and a gap clock signal extracted from a synchronous message is disclosed. A gap regulator module first re-maps the gapped data signal into a B-frame format and distributes the gaps in the data uniformly throughout the gapped data signal. A pointer leak logic module determines the bit leak rate as a function of received increment and decrement pointer adjustment signals. The pointer leak logic module determines the bit leak rate using separate algorithms. If the increment and decrement pointer adjustment signals are periodic in nature the bit leak rate is determined by dividing the periodic rate interval between two successive pointer adjustment signals by eight (8) and form a leak rate lookup table to account for any additional or missed pointer movements by looking up the incremental leak rate as a result. If the pointer adjustment signals are not periodic in nature, an exponential bit leak rate is used that is a function of the number of pointer adjustment signals that have been received. The pointer leak logic module provides a bit leak adjusted uniformly gapped data signal to a phase locked loop that provides a smooth output data signal and extracts a smooth output clock signal therefrom.

9 Claims, 6 Drawing Sheets

DS3 DESYNCHRONIZER WITH A MODULE FOR PROVIDING UNIFORMLY GAPPED DATA SIGNAL TO A PLL MODULE FOR PROVIDING A SMOOTH OUTPUT DATA SIGNAL

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

In a synchronous network digital payload data is carried at a particular clock frequency within a synchronous message format. This payload data may include both asynchronous digital data and synchronous digital data originating at a different data rate in a foreign digital network. The Synchronous Optical Network (SONET) and its European counterpart the Synchronous Digital Hierarchy (SDH) provide a standard format of transporting digital signals having various data rates, such as a DS-0, DS-1, DS-1C, DS-2, or a DS-3 signal and their European counterparts within a Synchronous Payload Envelope (SPE), or a container that is a part of a SONET/SDH STS-N/STM-N message frame. In addition to the digital data that is mapped and framed within the SPE or container, the STS-N/STM-N message frame also includes overhead data that provides for coordination between various network elements.

If the digital data that is mapped and framed in the STS-N/STM-N message was originally carried by a clock signal having a different frequency than the SONET/SDH line rate clock, certain adjustments to the framed digital data must be made. For example, if a DS-3 data signal carried by a 44.763 MHz clock signal is to be carried in a fiber-optic network by mapping the DS-3 signal into the SPE of an STS-1 message, extra bits must be added to the DS-3 signal prior to transmission through the SONET/SDH network. These extra bits are commonly referred to as stuff bits or gap bits and are merely place markers and carry no valid data. These gap bits are required because the DS-3 signal is slower than the SONET/SDH clock frequency, and hence there are not enough DS-3 bits at the higher frequency to form a complete SONET frame.

When the STS-1 message is received at the exit node, the overhead bytes must be removed from the SONET STS-1 message. The payload data that remains is de-framed and de-mapped into a serial data stream carried by a higher clock frequency than the nominal clock frequency of the payload data. In addition, the recovered data still contains the inserted gap data bits. If, for example, DS-3 data has been transported via a SONET/SDH network, the DS-3 data must be converted from the SONET clock signal to the lower frequency DS-3 clock signal and the gap data bits must be removed prior to the DS-3 signal being B3ZS-encoded for electrical re-transmission.

To transfer data from one clock domain to another, for example from the DS-3 embedded within the SONET signal rate to the proper DS-3 signal rate, typically a desynchronizer is used to provide a buffering mechanism between the clock signals. A desynchronizer typically includes an elastic store buffer that can be a first-in-first-out memory that receives gapped data recovered from a synchronized data payload as an input at one clock frequency and stores the data in appropriate storage locations. Data is read from the elastic store buffer at a different clock frequency and is provided as output data at that frequency. This output data does not contain the gap data bits that were added when the slower signal was mapped into the faster SONET/SDH STS-1 message.

Once the data has been de-mapped and de-framed from the SPE and the gaps removed, a phase locked loop (PLL) is typically used to recover the clock information and to adjust the read signal associated with the data stored in the elastic store for transmission downstream of a smooth data clock signal carrying a smooth data signal.

Although the SONET/SDH fiber optic network is a synchronous network, variations in clock signals across the network may occur. These variations in clock signals between various network elements may cause a loss of data downstream from the sender if the clock signal at which data was written to the synchronous signal and the clock signal at which the data was read from the synchronous payload are sufficiently different. A variety of conditions can cause variations in clock signals. For example, network clock instability, electrical noise and interference, effective changes in the length of transmission media, changes in the velocity of propagation, Doppler shifts, and irregular timing information and other electrical and network problems may all cause clock variations.

To mitigate the problems caused by clock variations across a network, the SONET/SDH STS-N/STM-N messages are provided with a pointer adjustment mechanism within the transmission overhead bytes that allow for some movement of the data within the SPE. The pointer adjustment mechanism includes a pair of bytes, H1 and H2, that identify the start of the next SONET/SDH payload byte and also indicate if the pointer adjustment byte, H3, is to be used. The third overhead byte, H3, provides for active pointer adjustment when a negative justification of the SPE is required. Positive justification involves marking the byte of after the H3 byte as a dummy or stuff byte, or as valid data. These pointer adjustments, which occur in the H1 and H2 transmission overhead bytes, allow for up to eight (8) bits of data to be added to a SONET/SDH message frame (using the H3 overhead byte) or for up to eight (8) bits to be removed from the frame. This allows for the SPE/container to be re-framed and re-synched at a network node that has a slightly different network clock. Thus, in addition to the gap data necessary to compensate for payload data that is carried by a different frequency clock signal, up to eight bits of data may be added or removed at each network element in the network due to clock instability in the network.

During a pointer adjustment, which may be also known as a pointer movement, the H1, H2, and H3 bytes may either add or deplete eight (8) bits to/from the recovered data signal at one time. Pointer adjustments can be periodic or aperiodic in nature. A periodic pointer adjustment may be caused, for example, when the SPE transporting the data has a constant clock offset at the output node of the network relative to the input node. An aperiodic or non-periodic pointer adjustment may be bursty in nature when caused by a transient problem or condition within the network.

Although the synchronous system may adjust the payload data using pointer adjustments to account for clock and phase variations, the clock and phase shifts caused by the pointer adjustments and/or the de-gapping of the payload data can affect the output rate of the data clock provided by the PLL. Typically, clock and phase shifts have two components. One is a high frequency jitter component that is classified as a clock or phase shift that is greater than 10 Hz. A second is a low frequency wander component that is classified as a clock or phase shift that is less than 10 Hz.

Jitter refers to the phase variations in the clock signal, which may cause errors in identifying bit positions and values accurately, and is therefore an issue in synchronous systems. Wander refers to phase variations that typically affect the frame and time-slot synchronization. Each network element adds some amount of noise to the SPE that eventually contributes to the timing instability in the form of jitter and wander in the recovered payload signal.

As is known, the PLL used to recover the smooth clock signal and smooth data signal is able to smooth out some phase jumps caused by pointer adjustments or asynchronous stuff bits. A PLL is most effective at filtering out high frequency jitter components, i.e., those with a frequency greater than 10 Hz., but is not effective at filtering out the low frequency wander components. Since, typically the wander components are much less than 10 Hz. these wander components are well within the bandwidth of the PLL and are passed without being attenuated. To construct a PLL with a small enough bandwidth to filter the wander components of the phase jumps, large time constants in the PLL control loops would require large component values for the resistors and capacitors used in the PLL. In addition, the large time constants required would result in a PLL that is slow to lock onto the reference signal and would cause long delays in recovering lock after a transient event.

One source of jitter and wander errors in the output data rate can be caused by the pointer adjustments within the synchronous signals. Each pointer adjustment signal or asynchronous gap data results in a data gap for a given number of clock cycles.

If the input data rate and/or the output data rate to and from the elastic store change by too large a value, it is possible that the elastic store can experience a data overflow condition or a data underflow condition. Data overflow occurs when data is written to the elastic store at a faster rate than usual, or read at a slower rate than usual, causing the elastic store to accumulate data faster than data is read from it. The elastic store will be unable to store all of the incoming data, and data will be lost. Similarly, data underflow occurs when data is written to the elastic store at a slower rate than usual, or read at a faster rate than usual, causing the elastic store to lose data. In this circumstance, undefined and unknown data will be read from the elastic store.

Typically, the elastic store used in the desynchronizer will have a write/read control system that attempts to maintain the output data rate at a specified rate, and maintain the elastic store at a predetermined fill level. If the elastic store begins to overfill, that is more data is being written into the elastic store than is being read from it, the elastic store may overflow and lose data. The write/read control system will increase the data output rate of the elastic store until the proper storage level in the elastic store is reached. Once the proper storage level is reached, the write/read control system will decrease the data output rate. If the elastic store begins to underfill, that is less data is being written into the elastic store than is being read from it, the elastic store may underflow and provide output data that is extraneous and undefined. The write/read control system will decrease the data output rate of the elastic store until the proper storage level in the elastic store is reached. Once the proper level is reached, the write/read control system will increase the data output rate.

When a pointer adjustment is received however, there may up to eight (8) bits that are added to the elastic store or skipped and not written to the elastic store. The inconsistent nature of the gapped data can result in large changes in the data output rate. Typically, pointer adjustments are resolved by "leaking" bits from the elastic store at a predetermined rate over a predetermined period of time. Leaking the bits one at a time prevents the excess bits from the pointer adjustment from negatively affecting the output data rate. Yet, as noted above, pointer adjustments may occur either periodically or non-periodically. A constant "bit leaking" rate is unable to adequately leak bits to cover a wide range of periodic pointer adjustments or bursty non-periodic pointer adjustments. If sporadic pointer bursts occur on top of the periodic pointer adjustments due to transient effects or if multiple pointer adjustments occur in a bursty fashion the fixed "bit leak" rate would be unable to respond and overflow or underflow of the elastic store may occur.

Thus it would be advantageous for a desynchronizer that is able to provide an output data rate of the extracted data having reduced jitter and wander and be able to adapt the output data rate to a plurality of pointer adjustments without sacrificing data integrity.

BRIEF SUMMARY OF THE INVENTION

An apparatus and a method for a desynchronizer for smoothing a gapped data signal and a gap clock signal extracted from a synchronous message is disclosed. A gap regulator module re-maps the gapped data signal into another frame format in which the gaps in the data are uniformly distributed throughout the gapped data signal. A pointer leak logic module determines the bit leak rate as a function of received increment and decrement pointer adjustment signals. The pointer leak logic module adaptively determines the bit leak rate using at least two separate algorithms. In one case, if the increment and decrement pointer adjustment signals are periodic in nature, the bit leak rate is determined by dividing the periodic rate interval between two successive pointer adjustment signals by eight (8). In a second case in which the pointer adjustment signals are not periodic in nature, an exponential bit leak rate is used that is a function of the number of pointer adjustment signals that have been received. The pointer leak logic module provides a uniformly gapped data signal that has been adjusted by bit leaking to a phase locked loop that provides a smooth output data signal and extracts a smooth output clock signal therefrom.

In one aspect, the gap regulator comprises a first-in-first out memory that is coupled to the gapped data signal and the gapped clock signal. A write address counter is coupled to the gapped clock signal and provides a write address pointer that is used by the first-in-first-out memory to store the incoming data. A read address counter is coupled to the reference clock signal and provides a read address pointer that is used to provide the address that data is output from the first-in-first-out memory. An address comparator receives the write address pointer and the read address pointer and is configured and arranged to provide a FIFO fill indicator signal as a function of the difference between the write address pointer and the read address pointer. A B-frame generator receives the FIFO fill signal and the reference clock signal and is configured and arranged to provide the plurality of new gap data position indicators and to indicate via the stuff bit position indicator if the clock cycle corresponding to the stuff bit is to be skipped. The read counter is coupled to the B-frame generator and is configured and arranged to skip a a clock cycle corresponding to one of the plurality of gap position indicators and to skip the clock cycle corresponding to the stuff bit when the stuff bit indicator indicates that the bit corresponding to that clock cycle is not a data bit, and to read the address corresponding to that instant when the stuff bit indicator indicates that the clock cycle of that indicator should contain valid data.

The B-frame generator includes a counter coupled to the reference clock signal that provides a reference clock count signal of the reference clock signal, and a gap indicator logic module coupled to the reference clock count signal and the FIFO fill indicator signal. The gap indicator logic module is configured and arranged to remap the plurality of gapped data contained in first-in-first-out memory into a B frame-format and to provide as an output a plurality of data in the B-frame format and a plurality of gap position indicators corresponding to the reference clock positions to be skipped from reading the first-in-first-out memory. In addition, the B-frame generator provides a stuff bit indicator that is indicative of a specific instant in the frame and an indicator if the data at that instant in the frame is a stuff bit or a data bit.

A B-frame includes 25 data sets of data, wherein each set of data includes 20 data subsets of data, and each subset of data includes 10 data bits of data. Within the data subsets of data, bit ten of every subset of data is a gapped bit; bit five of data subset twenty of every data set of data is a gapped bit; bit five of data subset ten of data set twelve is a gapped bit; and bit five of data subset ten of data set twenty-four is a stuff opportunity bit. Indicia is provided indicating whether the stuff opportunity bit is a valid data bit as determined by the gap indicator logic.

In another aspect, the pointer leak module includes a pointer leak write address counter that is coupled to the reference clock signal and to the plurality of gap position indicators and the stuff bit position indicator. The pointer leak write address counter is configured and arranged to provide an elastic store write address. An elastic buffer having a plurality of storage locations, receives the uniformly gapped data signal that includes a plurality of uniformly gapped data, the reference clock signal, and the elastic store write address. The elastic store is configured and arranged to write the received plurality of uniformly gapped data to one of the plurality of storage locations corresponding to the elastic store write address in accordance with the reference signal clock. A pointer offset and leak module receives the increment and decrement pointer adjustment signals and one of the plurality of gap position indicators. The pointer offset and leak module is configured and arranged to determine the periodicity or non-periodicity of the intervals between a plurality of occurrences of the increment and decrement pointer adjustment signals, and to determine a pointer offset value as a function of the plurality of occurrences of the increment and decrement pointer adjustment signals. The pointer offset and leak module provides as outputs a periodic interval signal containing indicia of whether the plurality of occurrences of the increment and decrement pointer adjustment signals are periodic and if so, a value of the periodicity, and the pointer offset value. A leak rate calculator module, receives the reference signal clock, the pointer offset value and the periodic interval signal and one of the plurality of gap position indicators. The leak rate calculator module is configured and arranged to determine a bit leak rate as a function of the pointer offset value and the periodic interval signal. The leak rate calculator module determines the bit leak as a function of a non-periodic plurality of occurrences or as a function of a periodic plurality of occurrences, the leak rate calculator module providing as an output a bit leak event signal. The pointer offset and leaking module receives the bit leak event signal and is configured and arranged to adjust the pointer offset value so as to reduce the magnitude of the pointer offset value by one for each bit leak event signal received. A pointer leak read address counter is coupled to the elastic store, to the reference clock signal and to the plurality of gap position indicators and the stuff bit indicator. The pointer leak read address counter is configured and arranged to provide as an output a read pointer address. A phase detector module receiving the elastic store write address, the elastic store read address, and the pointer offset value. The phase detector module is configured and arranged to determine the stuff bit control value, wherein the stuff bit control value indicates if the bit occupying the stuff opportunity bit position is a valid data bit or a stuff bit. In the event that the bit occupying the stuff opportunity bit position is a valid data bit, that data bit is read from the elastic store, otherwise, that data bit is a stuff bit and is skipped. The pointer leak read address counter receives the stuff bit control value and is configured and arranged to adjust the read pointer address as a function of the stuff bit control value. The elastic store is configured and arranged to read the data stored at the storage locations corresponding to the received read address pointer and to provide a uniformly gapped data signal containing a plurality of uniformly gapped data.

BRIEF DESCRIPTION OF THE SEVERAL VIEWS OF THE DRAWING

The invention will be more fully understood from the following detailed description taken in conjunction with the accompanying drawings in which.

DETAILED DESCRIPTION OF THE INVENTION

Figure 1:
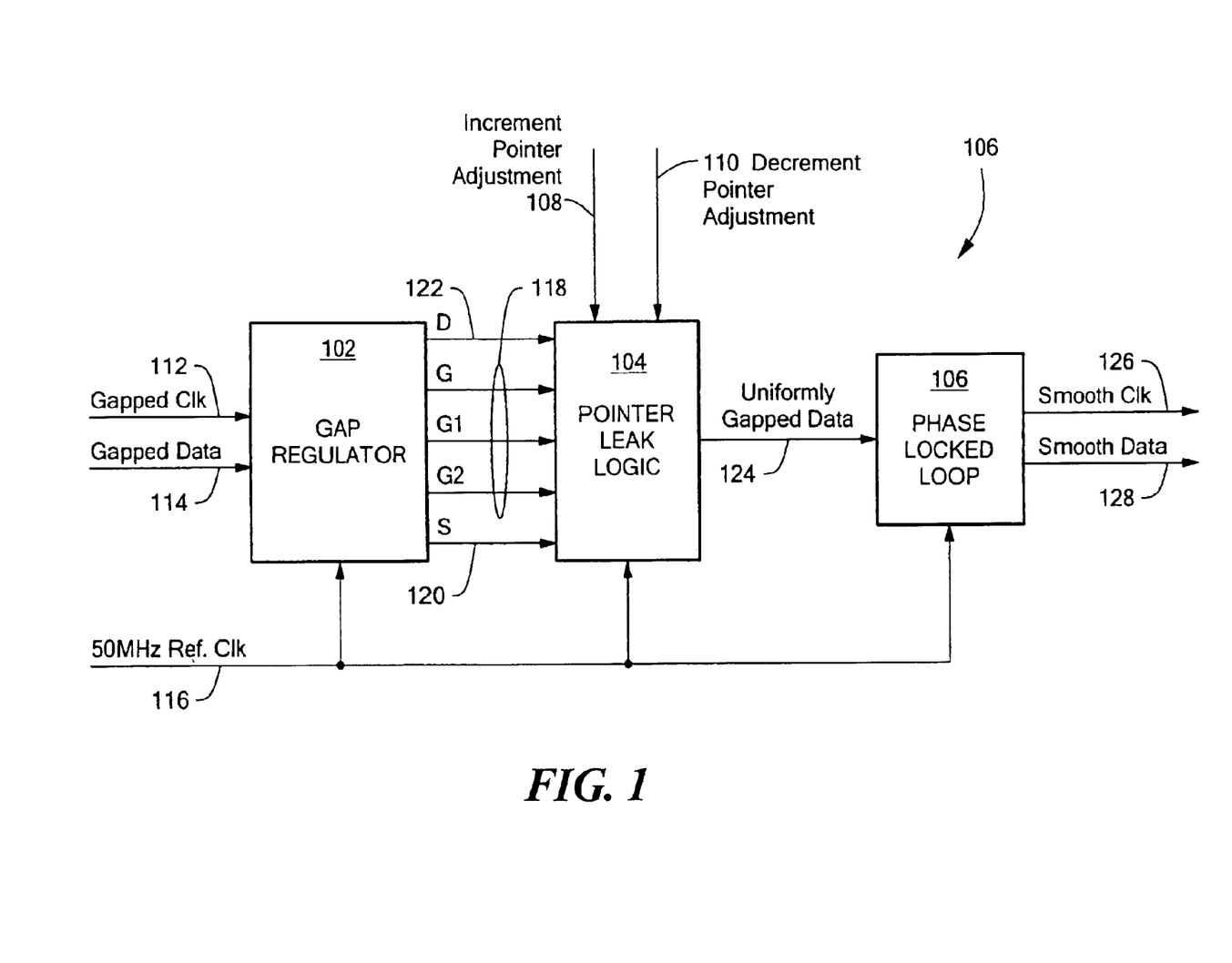
FIG. 1 is a block diagram of one embodiment of the apparatus for desynchronizing data transmitted in a synchronous signal.

FIG. 1 illustrates one embodiment of a desynchronizer 100 in accordance with the present invention. The desynchronizer 100 includes a gap regulator module 102, a pointer leak logic module 104, and a phase locked loop (PLL) 106. The gap regulator module 102 receives a gapped clock signal 112 and a gapped data signal 114 that have been recovered from a synchronized message (not shown) and a reference clock signal 116. The gapped data signal 114 includes a plurality of data and a plurality of gaps. As used herein, Gap data refers to the data recovered from a synchronous payload envelope, such as from a SONET STS-N/STM-N/STM-N message, that includes the gaps or stuff bits that were inserted to adjust the payload data to the faster SPE clock frequency.

The gap regulator module 102 is configured and arranged to determine new positions for the gapped bits that will uniformly redistribute the gaps throughout the plurality of gapped data signal 114. The gap regulator module 102 provides a plurality of gap position indicators 118 corresponding to the new positions of the gapped bits within a uniformly gapped data signal 122. As will be explained in more detail below, a stuff opportunity bit position indicator 120 is also provided and indicia of whether the stuff bit is data or gap are also provided. The pointer leak logic module 104 receives the plurality of gap position indicators 118 and the stuff bit opportunity position indicator 120 within the uniformly gapped data signal 122 from the gap regulator module 102. The pointer leak logic module 104 also receives the reference clock signal 116, the increment pointer signal 108 and the decrement pointer signal 110. The pointer leak logic module 104 is configured and arranged to determine a bit leak rate in response to the increment and decrement pointer signals 108 and 110 and to adjust the uniformly gapped data signal to prevent the loss of data due to the increment and decrement pointer adjustments. The pointer leak logic module 104 provides an output of an adjusted uniformly gapped data signal 124. The phase locked loop (PLL) 106 receives the adjusted uniformly gapped data signal 124 and the reference clock signal 116 and is configured and arranged to provide a smooth output data clock 126 and a smooth output data signal 128 that is without gaps.

Figure 2:
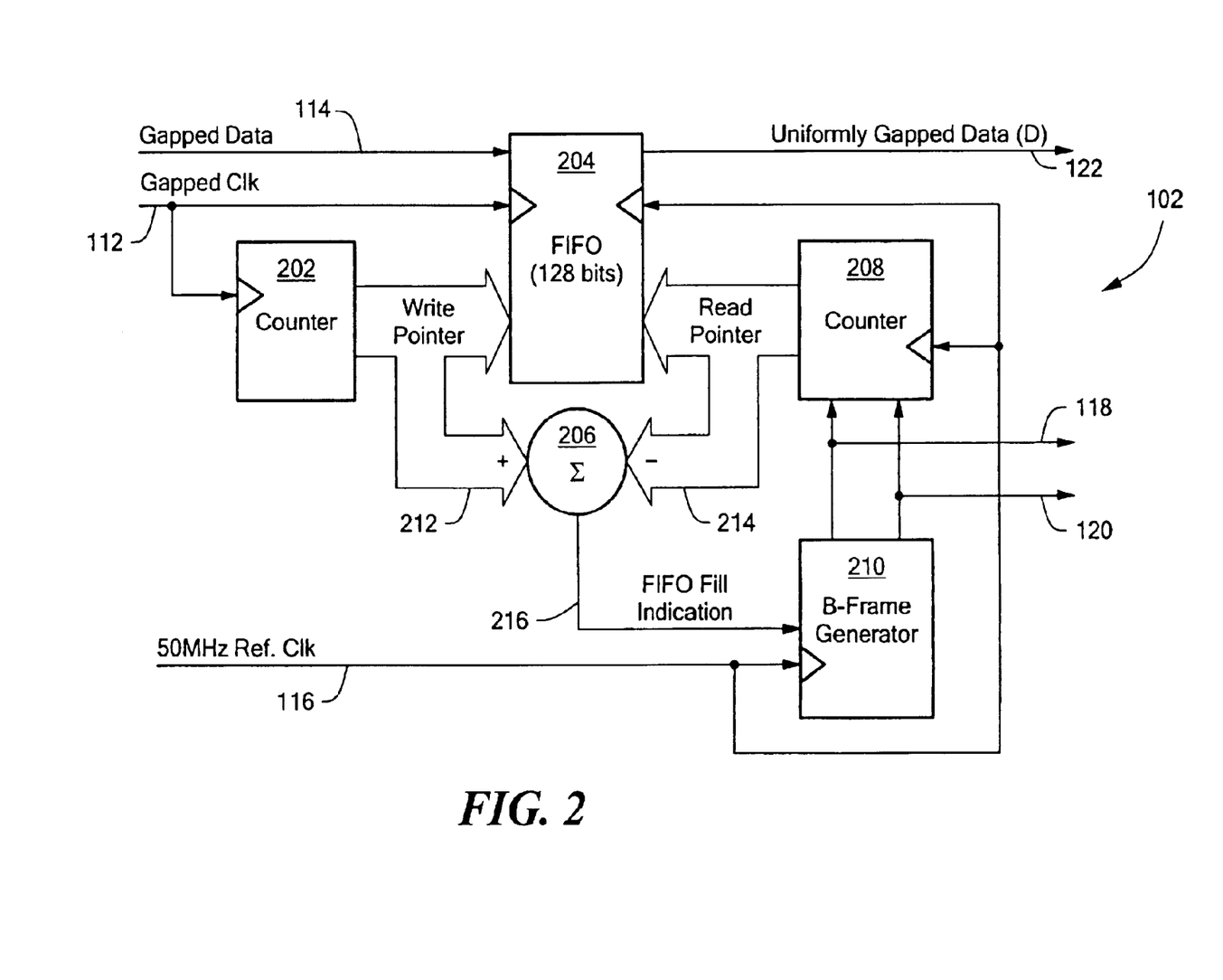
FIG. 2 is a detailed block diagram of the gap regulator module 102 shown in FIG. 1.

FIG. 2 illustrates one embodiment of the gap regulator module 102. The gap regulator module 102 includes a write address counter 202 that receives the gapped clock signal 112 and provides a write address pointer 212 to a first-in-first-out (FIFO) buffer 204. The FIFO buffer 204 receives the gapped data signal 114 and writes the received gapped data at the storage address provided by the write address counter 202. A read address counter 208 receives the reference clock signal and provides a read address pointer 214 to the FIFO buffer 204. The FIFO buffer 204 provides as an output uniformly gapped data 122 stored as data at the storage locations specified by the read address pointer 214.

An address comparator 206 subtracts the read address pointer 214 from the write address pointer 212 and provides a FIFO fill signal 216 that is indicative of the amount of data stored within the FIFO buffer 204. A B-Frame generator 210 receives the FIFO fill signal 216 and the reference clock 116 and is configured and arranged to re-map the received data into a B-frame format. The B-frame format operates at the frequency of the reference clock signal 116.

Figure 3:
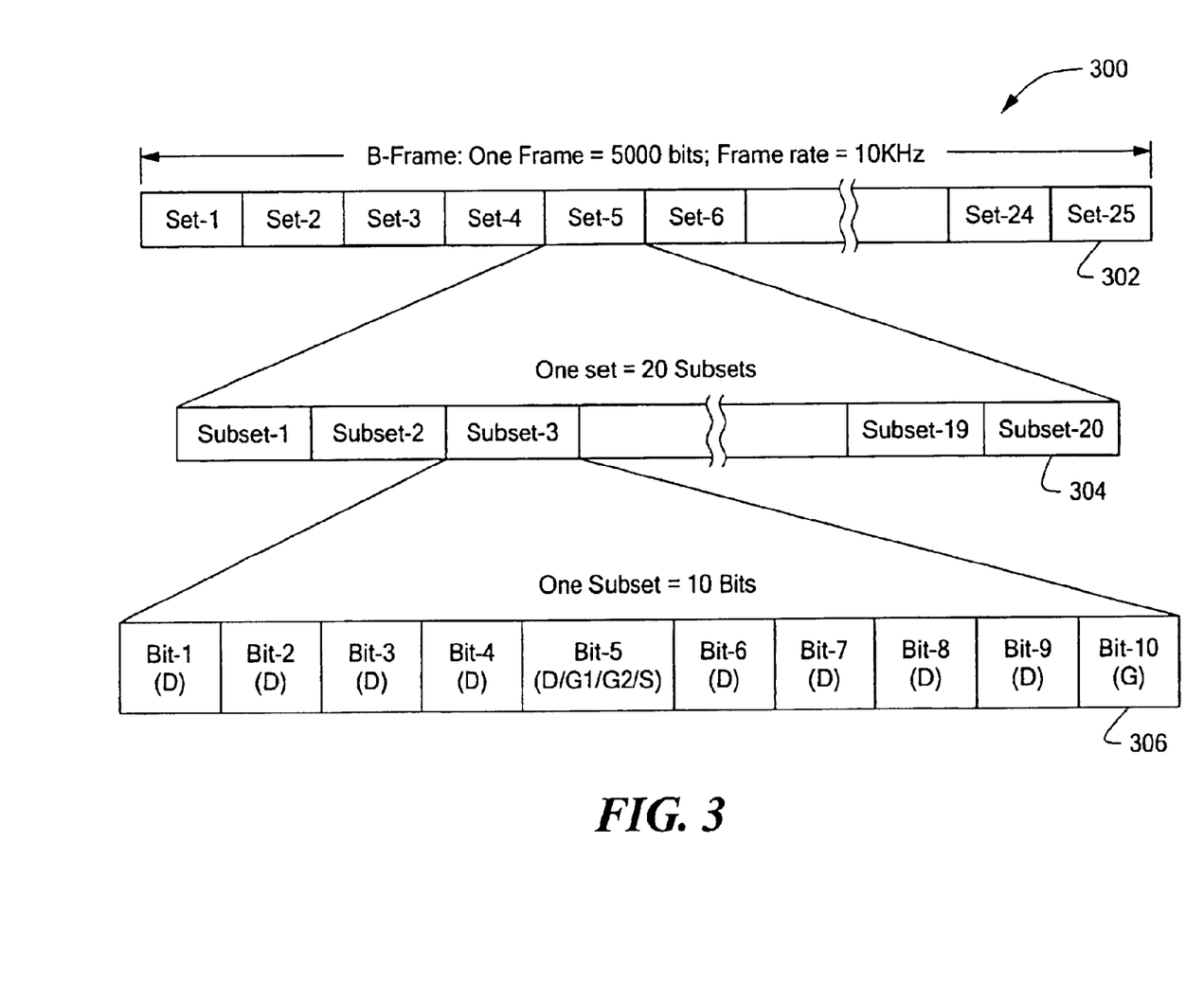
FIG. 3 is a block diagram of the B-frame format formed by the B-frame generator shown in FIG. 2.

FIG. 3 illustrates the B-frame format 300. The B-frame format 300 is made up of 25 data sets 302, wherein each data set 302 contains 20 data subsets 304. Each data subset 304 includes ten (10) bits 306. Thus, each frame of the B-frame format 300 includes 5000 bits. With a 50 MHz reference clock signal the B-frame format has a repetition rate of 10 KHz. In a preferred embodiment in which the DS-3 signal is used as the payload data, only 4473 or 4474 bits of the 5000 bits per frame form the nominal DS-3 signal. The remaining 527 or 528 bits are either gapped bits that are ignored or a stuffing opportunity bit that can be either a gap bit or a data bit. In this preferred embodiment using the DS-3 signal as the payload data, bit ten (10) 310 of every subset is a gap bit and designated as a G-bit. Thus, there are 500 G bits per frame. Bit five (5) of subset twenty (20) of all sets is a gap bit and designated as a G1-bit. Thus, there are 25 G1-bits per frame. Bit five (5) of subset ten (10) of set twelve (12) is an additional gap bit and designated as a G2-bit. Thus, there is only one (1) G2-bit per frame. Bit 5 of subset ten (10) of set twenty-four (24) is the stuffing opportunity bit, designated as an S-bit. Thus, there is only one S-bit per frame.

Referring again to FIG. 2, the B-frame generator 210 determines the positions of the G, G1, and G2 bit positions and provides this plurality of gap position data to the read address counter 208. The read address counter 208 is configured and arranged to skip the clock positions corresponding to the plurality of gap positions indicators or to otherwise disable reading data from the FIFO buffer 204. In addition, the B-frame generator 210 is also configured and arranged to provide indicia with the S-bit position indicator whether the S-bit is to be a valid data bit or a gapped bit. If the FIFO fill signal 216 indicates that FIFO buffer 204 is filled with data exceeding a predetermined level, the S-bit is designated a data bit and accordingly is read from the FIFO buffer 204. If the FIFO buffer is filled with data not exceeding the predetermined level, the S-bit is a gapped bit and the reading of the FIFO buffer 204 is skipped. In a preferred embodiment, the predetermined level of the FIFO buffer 204 is 50%.

The frequency at the output of the gap regulator module 102 is determined by the value of the S-bit in every frame. In the embodiment in which the DS-3 signal is used as the payload data and the reference clock signal is 50 MHz., the frequency 4473.6×10 KHz=44,736,000 bits per second, where 4473 Data bits+0.6 S-bits provide the nominal values. This means that on average six (6) S-bits out of every ten (10) frames must be data bits and the other four (4) S-bits are gapped bits to be skipped. The gap regulator module 102 provides the plurality of gap position indicators 118, the S-bit position indicator 120 and a uniformly gapped data signal 122 as outputs.

In this way, the gap regulator module 102 regularizes the gaps present in the incoming data signal and has uniformly distributed them in either bit five (5) or bit ten (10). In this way, the gap data to be skipped occurs only on every $5^{th}$ bit of the reference clock signal 116. In addition, as will be explained in more detail below, the S-bit provides a means for compensating the output gapped clock signal 112 for pointer movements.

When a pointer adjustment occurs, there is either an addition or a depletion of 8-bits of data at once. This causes the FIFO 204 in the gap regulator module 102 to be either filled up or depleted by 8 bits. This will result in the FIFO fill signal 216 being either high or low continuously for 8 frames depending on whether eight (8) bits were added or depleted from the SPE. As a result the S-bit position is used as either a data bit or a gapped bit respectively. If one bit is adjusted by the S-bit in each frame, then the S-bit will be utilized for (8) continuous frames. This added or depleted data causes a phase hit to the PLL that can cause a loss of data or a change in the output frequency of the recovered clock. In order to avoid this phase hit to the PLL the rate at which the added or depleted data is provided to the PLL should be adjusted to not influence the PLL operation, that is the rate should be adjusted to hide the phase hit from the PLL.

Figure 4:
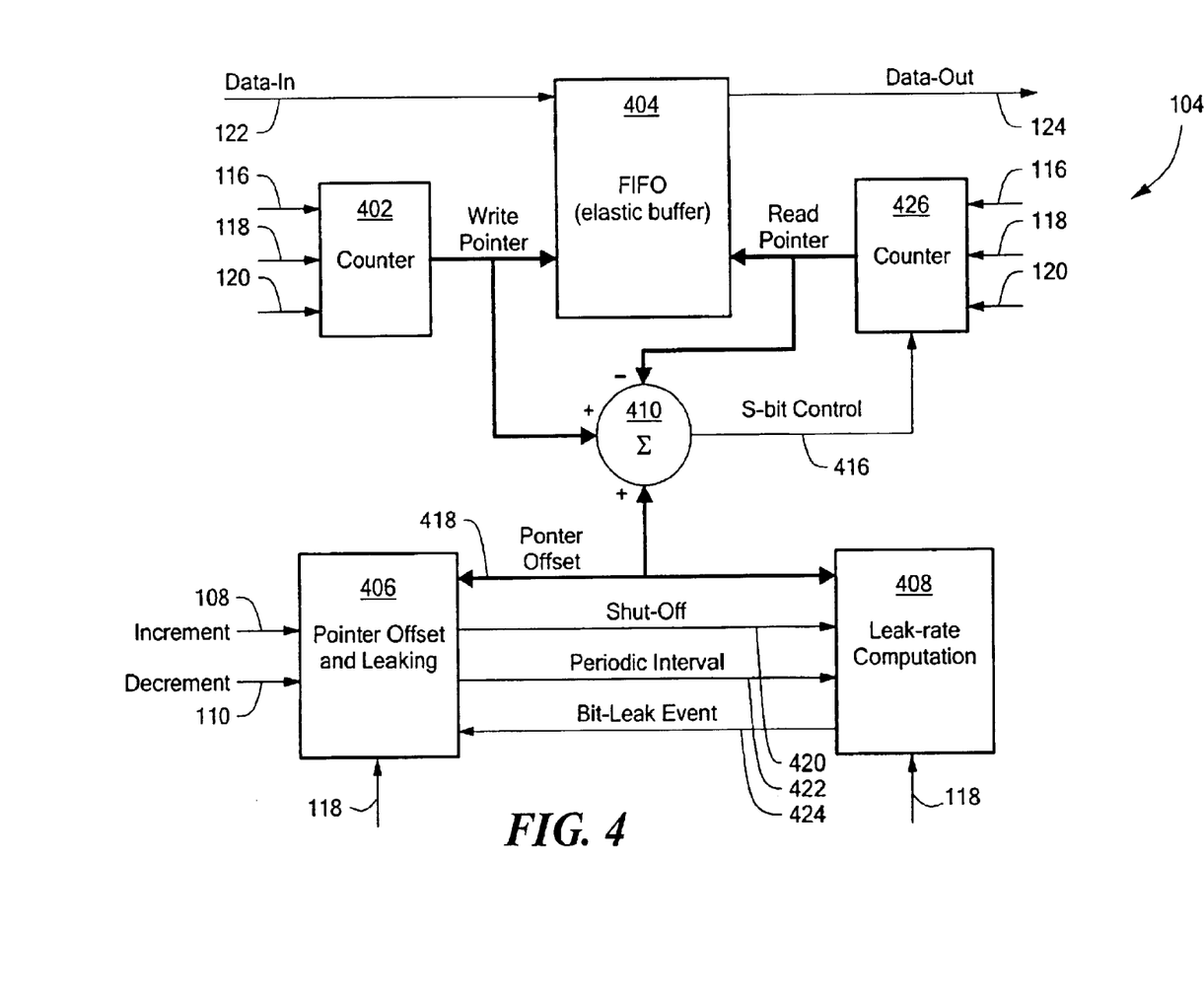
FIG. 4 is detailed block diagram of the pointer leak logic module illustrated in FIG. 1.

FIG. 4 illustrates one embodiment of the pointer leak logic module 104 that is used to hide the phase hit from the PLL by adjusting the bit leak rate. The pointer leak logic module 104 uses the B-frame plurality of gap position indicators and the S-bit position indicator generated by the gap regulator module 102 to generate another gapped data stream that uses the same plurality of gap position indicators received from the gap regulator module 102. All the gapping instances of the adjusted uniformly gapped data signal 124 provided by the pointer leak logic module 104 are the same as the uniformly gapped data signal 122 except for the value of the S-Bit. As will be explained below, the S-bit is utilized to carry a data bit in the next B-frame when a bit leak event is signaled. This data rate of the S-bit is utilized to effectively hide the phase hit from the PLL as the bits are leaked out bit-by-bit using the S-bit over a much longer time interval.

As illustrated in FIG. 4 the pointer leak logic module 104 includes a write address counter 402 that receives the reference clock signal 116 and the plurality of gap position indicators and the S-bit position indicator. The write address counter 402 provides a storage location address to an elastic store buffer 404 that receives the uniformly gapped data signal 122 and stores the plurality of data contained within the uniformly gapped data signal 122 at the indicated location. In addition, the data is stored within the elastic store buffer 404 in the same data format as the uniform gapped data signal received from the gap regulator module 102. A read address counter 426 receives the plurality of gap position indicators, the S-bit position indicator, and the reference clock signal 116 and provides a read address pointer 414 to the elastic store buffer 404.

The pointer offset and leak module 406 receives the increment and decrement pointer signals 108 and 110 respectively and the G2 gap position indicator, and is configured and arranged to determine a pointer offset value 418. The pointer offset value 418 is a function of the number of received increment and decrement pointer signals 108, 110 and a received bit leak event signal 424. The pointer offset and leak module 406 uses the G2 bit from a plurality of gap position indicators 118. The G2 bit only occurs once per frame, and is used to time the incoming increment and decrement pointer adjust signals 108, 110. If the pointer adjustment signals 108, 110 consistently occur at an interval of one-second or less the pointer adjustment signals 108, 110 are considered to be periodic. The periodic interval of the periodic pointer signals 108, 110 is provided as an output signal 422.

In the absence of pointer movement and assuming that all preceding pointer effects have been leaked out, the pointer offset value 418 is set to zero. The phase detector 410 adds the write address pointer 412 and the pointer offset value 418 and subtracts the read address pointer 414 from the sum to determine whether the S-bit should be filled with data or a gap. In the event that a increment pointer signal 108 is received, the uniformly gapped data 122 will have eight (8) fewer bits, which would deplete the elastic store buffer 404 by eight (8) bits. To offset this effect, the pointer offset value 418 is incremented by eight (8) bits with each increment pointer signal 108 received by the pointer offset and leak module 406. Similarly, in the event that a decrement pointer signal 110 is received, the uniformly gapped data signal will have eight (8) additional bits that would tend to fill up the elastic store buffer by eight (8) bits. To offset this effect the pointer offset value 418 is decremented by eight (8) bits with each decrement pointer signal 110 received.

The pointer offset value 418 is provided to the leak rate computation block 408 by the pointer offset and leak module 406 along with the periodic interval value 422. The leak rate computation module 408 determines the bit leak rate and provides a bit leak event signal to the pointer offset and leak module 406. The bit leaking is carried out on a bit-by-bit basis. For every bit leak event triggered by the bit leak event signal 424, which is generated by the bit leak computation module 408, the pointer offset value 418 is changed by one bit in the direction that reverses the offset due to the received increment or decrement pointer adjustment signals 108, 110. In this way the pointer offset value 418 is adjusted so that the magnitude of the offset value is decreased with each bit leak event.

The leak rate computation module 408 uses an adaptive algorithm that continuously tracks the current pointer offset value 418 to compute the bit-leaking interval. In general, the greater the magnitude of the pointer offset value 418 becomes, the shorter the bit-leaking interval. Conversely, the smaller the magnitude of the value of the pointer offset value 418 is, the longer the bit-leaking interval.

As discussed above the pointer adjustment signals may be periodic or non-periodic in nature. The pointer offset and leak module 406 determines if a sequence of received pointer adjustments are periodic or not, and if the pointer adjustment signals are periodic, the pointer offset and leak module provides an output signal 422 indicative of the periodic interval. In one embodiment in which the synchronous network is a SONET/SDH network, periodic pointer movements may occur when the synchronized payload envelope (SPE) containing the data has a constant clock offset at the output node of the network, relative to the input node. In this circumstance to maintain synchronization, the pointer movements must occur continuously and precisely at an interval that is a function of the clock offset. Because the pointer offset signals are received in a periodic manner a simple linear-weight algorithm may be used to determine the nominal leak rate. In one embodiment, the nominal leak rate is obtained by dividing the pointer interval, which may be in terms of the number of B-frames in one period or in terms of the time of one period, by eight (8) bits. In this way, each periodical pointer adjustment can be completely leaked out before the onset of the next periodic pointer adjustment.

Figure 5:
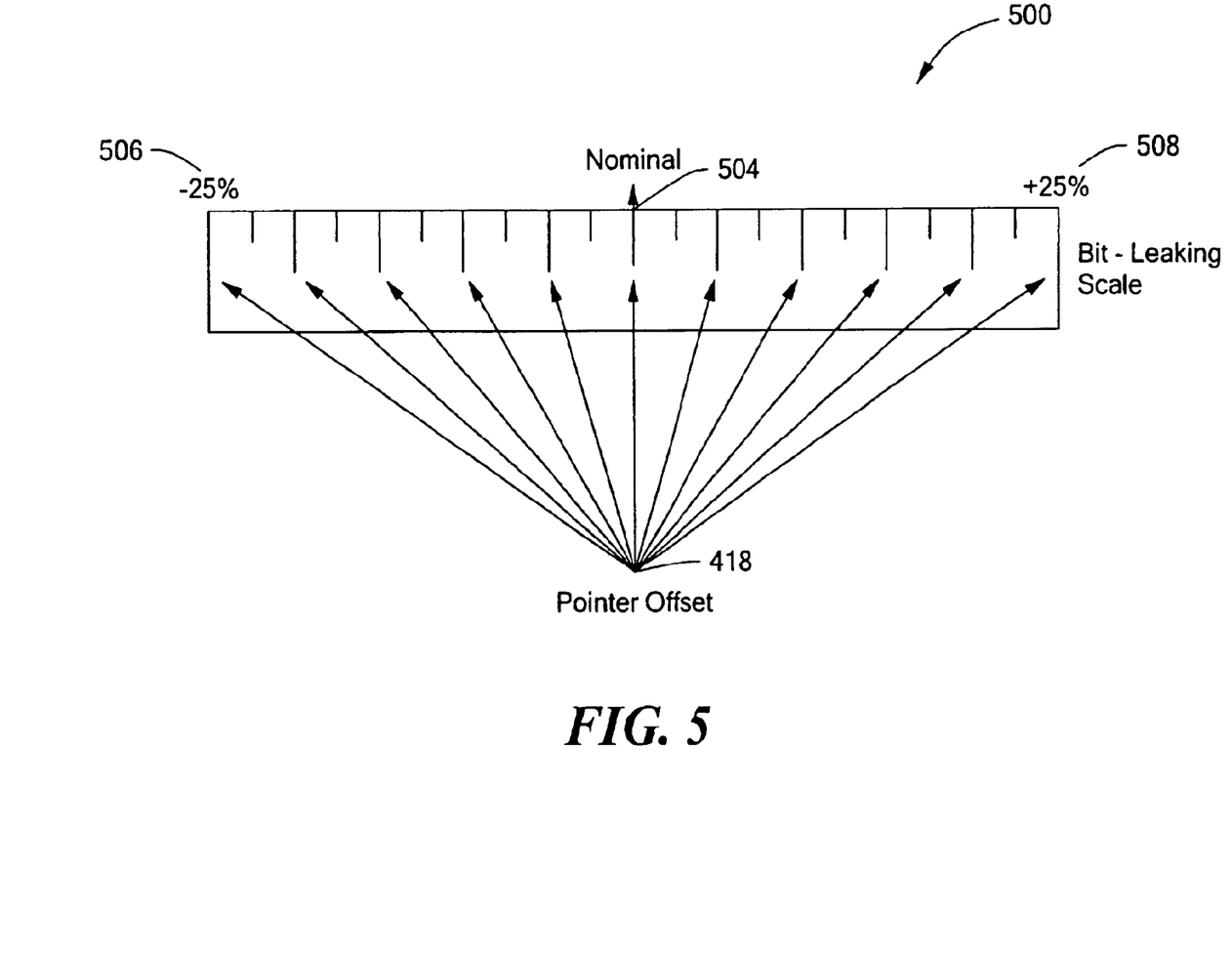
FIG. 5 is a schematic illustration of a leak rate offset scale used by the leak rate computation module shown in FIG. 4.

However as provided for in the SONET/SDH standards, it is possible that an occasional pointer adjustment is made, or that a pointer adjustment is missed. In the event that this occurs, the simple interval÷8 leaking rate is not sufficient to hide the sporadic added or cancelled pointer adjustment from the PLL 108. In this case, the leak rate computation module 408 monitors the interval between subsequent pointer adjustment signals and adjusts the bit leak rate accordingly. In one embodiment, the bit leak rate module 408 uses a sliding bit-leak scale illustrated in FIG. 5 to adjust the bit leak rate. The bit leak scale 500 has at the center of the scale 504 the nominal leak rate determined by the simple interval÷8 leaking rate from above. On either side of the center are the values for the incremental change in the leak rate that would result had these intervals been different. The pointer offset value 418 is used to determine the leak rate such that if the offset value 418 corresponds to the exact nominal leak rate at the center of the scale 504 then the nominal leak rate obtained by dividing the pointer interval value by eight (8) is used. For changes in the pointer offset value 418 indicating that other pointer adjustments have been received or an expected pointer adjustment missed, the pointer offset value 418 is no longer the nominal leak rate value and the percentage change in the nominal leak rate corresponds to the percentage change in the pointer offset value from the nominal center of the scale 504. In the illustrated embodiment, a scale from +/−25% change in the nominal leak rate may be used.

However, the increment and decrement pointer signals 108, 110 may be bursty and non-periodic in nature and cause the pointer offset value 418 to build up suddenly before a single bit-leaking event can occur. In this case, a simple linear weight-based algorithm is not capable of responding to this burst of pointer adjustments and data overflow or underflow may occur during the interval before any bit-leaking can occur. In a preferred embodiment, the bit leak computation module 408 uses an exponential algorithm to compute the bit leak rate for non-periodic burst pointer adjustments. For a single pointer adjustment the leak rate can be very slow and it may take several hours before the entire pointer has been leaked out. As more pointer adjustment signals are received however, the leak rate is increased by reducing the leaking interval by one-half for every additional pointer movement that is received until an equilibrium is reached between the rate of arrival of the pointer adjustment signals and the bit leaking interval.

The pointer offset value 418, adjusted by any bit-leak events, is provided to the phase detector 410 along with the write address pointer 412 and the read address pointer 414. If there is a positive difference from the phase detector 410, which indicates that there is more data in the elastic store than optimum, the S-bit control indicates that the S-bit is to be filled with data. If there is a negative difference from the phase detector 410, which indicates that there is less data in the elastic store than optimum, the S-bit control indicates that the S-bit is to be a gap.

Since the bit leaking using the S-bit occurs on a 10 KHz frame boundary, the leak rate cannot be maintained in the event of periodic pointer adjustments having a very short periodic interval. This high periodic rate can lead to a FIFO error and data corruption. However, since the rapid pointer adjustments produce high frequency periodic phase variations, these phase variations can be easily filtered out by the PLL loop alone. Therefore, if the periodic interval detected by the pointer offset and leak module 406 exceed a predetermined rate, a shut off signal 420 is provided to the leak rate computation module 408 and causes the leak rate computation module 408 to cease providing leak event signals 422 until the periodic interval drops below the predetermined value.

Figure 6:
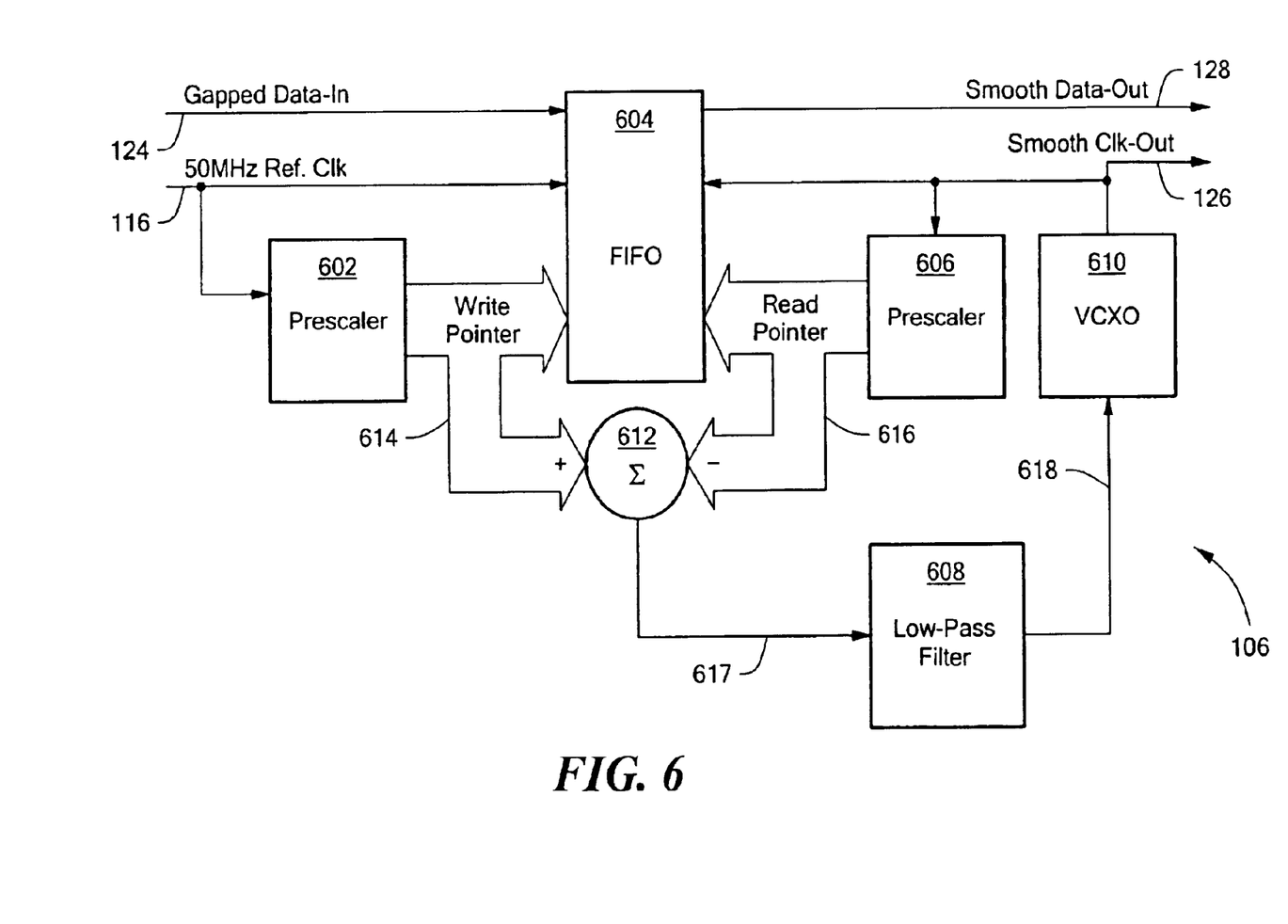
FIG. 6 is a detailed block diagram of the phase locked loop 106 shown in FIG. 1

FIG. 6 illustrates one embodiment of a phase locked loop (PLL) 106. The phase locked loop is a standard PLL that includes a prescaler 602 that receives the reference clock signal 116 and provides a write address pointer 612 to the FIFO 604. The FIFO 604 receives the adjusted uniformly gapped data 124 and the reference clock signal 116 and stores the received data at the storage location corresponding to the write address pointer 614. A voltage controlled crystal oscillator (VCXO) 610 generates a smooth clock output signal 126 that is provided to the FIFO 604 and also to a prescaler 606 that generates a read address pointer 616. The read address pointer 616 is provided to the FIFO 604 and the FIFO 604 provides an output of data stored in the storage location corresponding to the read address pointer 616. The write address pointer 614 and the read address pointer 616 are provided to a phase detector 612 that determines the difference 617 between the two address pointers. This difference output 617 is filtered by low pass filter 608 and provided as a correction signal 618 to the VCXO 610. The VCXO 610 adjusts the frequency of the smooth output clock signal such that the write address and the read address stay locked to within a few locations of the FIFO buffer 604. This provides a smooth data output signal 128 along with a smooth output clock signal 126 that are substantially free from jitter and wander caused by pointer adjustments that occurred during the transmission of the data through the synchronous network.

Those of ordinary skill in the art should further appreciate that variations to and modification of the above-described apparatus and method for desynchronizing DS-3 data may be made without departing from the inventive concepts disclosed herein. Accordingly, the invention should be viewed as limited solely by the scope spirit of the appended claims.

What is claimed is:

1. A desynchronizer for a data signal extracted from a synchronous message, the data signal including a gapped clock signal having a first frequency, a gapped data signal including a plurality of data and a plurality of gaps interspersed within the plurality of data and an increment pointer adjustment signal and a decrement pointer adjustment signal, the desynchronizer comprising:

a gap regulator module receiving the gapped clock signal, the gapped data signal, and a reference clock signal, the gap regulator module configured and arranged to redistribute the plurality of gaps to a plurality of new gapped positions uniformly distributed throughout the plurality of data forming a plurality of uniformly gapped data, the gapped regulator providing as an output a plurality of new gapped position indicators corresponding to a plurality of determined gapped positions and a stuff bit position indicator corresponding to a stuff opportunity bit position, and a uniformly gapped data signal including the uniformly gapped plurality of data;

a pointer leak logic module receiving the plurality of new gap data position indicators, the stuff opportunity bit position indicator, and the uniformly gapped data signal from the gap regulator module and the increment and decrement pointer adjustment signals, the pointer leak logic module configured and arranged to determine a bit leak rate in response to the increment and decrement pointer adjustment signals and to modify the uniformly gapped data signal as a function of the bit leak rate over a predetermined period of time and to provide as an output a bit leak adjusted uniformly gapped data signal; and a phase locked loop receiving the bit leak rate adjusted uniformly gapped data signal from the bit leak logic module and a reference clock signal, the phase locked loop configured and arranged to provide as an output an ungapped smooth data signal and an ungapped smooth data clock signal.

2. The desynchronizer of claim 1 wherein the gap regulator comprises:

a first-in-first-out memory coupled to the gapped data signal and the gapped clock signal;

a write address counter coupled to the gapped clock signal and providing a write address pointer;

a read address counter coupled to the reference clock signal and providing a read address pointer;

the first-in-first-out memory coupled to the write address pointer, the read address pointer, and the reference clock signal, the first-in-first-out memory configured and arranged to write the received portion of the plurality of gapped data contained within the gapped data signal into an address specified by the write address pointer and to read data from the address specified by the read address pointer at the reference clock rate;

an address comparator receiving the write address pointer and the read address pointer, the address comparator configured and arranged to provide a FIFO fill indicator signal as a function of the difference between the write address pointer and the read address pointer;

a B-frame generator receiving the FIFO fill signal and the reference clock signal, the B-frame generator configured and arranged to provide the plurality of new gap position indicators and to indicate via the stuff opportunity bit position indicator and if the stuff opportunity bit is to be skipped; and the read counter coupled to the B-frame generator and configured and arranged to skip a clock cycle in the frame corresponding to one of the plurality of gap position indicators and to skip a bit corresponding to the stuff opportunity bit indicator when the stuff opportunity bit indicator indicates that a stuff opportunity bit is a gapped bit and to read the address corresponding to the stuff opportunity bit indicator when the stuff opportunity bit indicator indicates that the stuff opportunity bit is a data bit.

3. The desynchronizer of claim 2 wherein the B-frame generator comprises:

a counter coupled to the reference clock signal providing a reference clock count signal of the reference clock signal; and gap indicator logic coupled to the reference clock count signal and the FIFO fill indicator signal, the gap indicator logic configured and arranged to remap the plurality of gapped positions contained in incoming data signal into a B frame-format and to provide as an output a plurality of gap position indicators corresponding to the clock cycles of the reference clock signal to be skipped and a stuff opportunity bit indicator indicative of a specific bit position in the B-frame and an indicator if the data in the stuff opportunity bit position is a stuff bit or a data bit.

4. The desynchronizer of claim 3, wherein the B frame-format comprises:

twenty five sets of data, each set of data comprising 20 subsets of data, and each subset of data comprising 10 bits of data;

bit ten of every subset of data being a gapped bit;

bit five of subset twenty of every set of data being a gapped bit;

bit five of subset ten of set twelve being a gapped bit; and bit five of subset ten of set twenty-four is a stuff opportunity bit and an indicator will be indicating that the stuff opportunity bit is a valid data bit by the gap indicator logic when the FIFO fill signal indicates that the first-in-first-out memory is more than 50% full.

5. The desynchronizer of claim 1 wherein the pointer leak logic module comprises:

a pointer leak write address counter, coupled to the reference clock signal and to the plurality of gap position indicators and the stuff bit position, the pointer leak write address counter configured and arranged to provide an elastic store write address;

an elastic buffer having a plurality of storage locations, receiving the uniformly gapped data signal and the included plurality of uniformly gapped data, the reference clock signal, and the elastic store write address, the elastic store configured and arranged to write the received plurality of uniformly gapped data to one of the plurality of storage locations corresponding to the elastic store write address in accordance with the reference signal clock;

a pointer offset and leak module receiving the increment and decrement pointer adjustment signals and one of the plurality of gap position indicators, the pointer offset and leak module configured and arranged to determine the periodicity or non-periodicity of the intervals between a plurality of occurrences of the increment and decrement pointer adjustment signals, and to determine a pointer offset value as a function of the plurality of occurrences of the increment and decrement pointer adjustment signals and the number of bits leaked out, the pointer offset and leak module providing as outputs a periodic interval signal containing indicia of whether the plurality of occurrence of the increment and decrement pointer adjustment signals are periodic and if so, a value of the periodicity, and the pointer offset value;

a leak rate calculator module, receiving the reference signal clock, the pointer offset value and the periodic interval signal and one of the plurality of gap position indicators, the leak rate calculator module configured and arranged to determine a bit leak rate as a function of the pointer offset value and the periodic interval signal, wherein the leak rate calculator module determines the bit leak as a function of a non-periodic plurality of occurrences or as a function of a periodic plurality of occurrences, the leak rate calculator module providing as an output a bit leak event signal;

the pointer offset and leaking module receiving the bit leak event and configured and arranged to adjust the pointer offset value so as to reduce the magnitude of the pointer offset value by one for each bit leak event signal received;

a pointer leak read address counter, coupled to the elastic store, to the reference clock signal and to the plurality of gap position indicators and the stuff bit indicator, the pointer leak read address counter configured and arranged to provide as an output a read pointer address;

a phase detector module receiving the elastic store write address, the elastic store read address, and the pointer offset value, the phase detector module configured and arranged to determine the stuff bit control value, wherein the stuff bit control value indicates if the bit corresponding to the clock cycle of the reference clock signal is a valid data bit, in the event that the bit occupying the stuff opportunity bit position is a valid data bit that data bit is read from the elastic store, otherwise, that data bit is a stuff bit and the elastic store is not read;

the pointer leak read address receiving the stuff bit control value and configured and arranged to adjust the read pointer address as a function of the stuff bit control value;

the elastic store configured and arranged to read data stored at the storage locations corresponding to the received read address pointer and to provide a uniformly gapped data signal containing a plurality of uniformly gapped data.

6. A method of desynchronizing a data signal extracted from a synchronous message, the data signal including a gapped clock signal having a first frequency, a gapped data signal including a plurality of data and a plurality of gap data interspersed within the plurality of data and an increment pointer adjustment signal and a decrement pointer adjustment signal, the method comprising the steps of:

receiving a gapped clock signal having a first frequency and a gapped data signal including a plurality of data and a plurality of gaps interspersed within the plurality of data;

receiving an increment pointer adjustment signal and a decrement pointer adjustment signal redistributing the plurality of gap data within the plurality of data to a plurality of new gap data positions;

determining a bit leak rate as a function of the received increment pointer adjustment signal and a decrement pointer adjustment signal; and providing a smooth data signal and a smooth data clock signal using the bit leak rate to leak out the effects of the received increment pointer adjustment signal and decrement pointer adjustment signal without affecting the smooth data signal.

7. The method of claim 6, wherein determining the bit leak rate includes:

receiving at least one of the increment pointer adjustment signal and a decrement pointer adjustment signal;

measuring the interval between subsequent received increment pointer adjustment signal and decrement pointer adjustment signal is consistently less than one second;

in the event that the measured interval between subsequent received increment pointer adjustment signal and decrement pointer adjustment signal is consistently less than one second provide indicia that the received increment pointer adjustment signal and decrement pointer adjustment signal are periodic and provide an indication of the periodic interval;

in the event that the received increment pointer adjustment signal and decrement pointer adjustment signals are periodic, determine the bit leak rate by dividing the periodic interval by eight;

in the event that the measured interval between subsequent increment pointer adjustment signals and decrement pointer adjustment signals is not consistently less than one second, provide indicia that the received increment pointer adjustment signals and decrement pointer adjustment signals are non-periodic;

in the event that the received increment pointer adjustment signals and decrement pointer adjustment signals are non-periodic set the bit leak rate to a first value;

in the event that the received increment pointer adjustment signals and decrement pointer adjustment signals, for each received increment pointer adjustment signal and decrement pointer adjustment signal, reduce the bit leak rate by a predetermined amount.

8. The method of claim 7 wherein the predetermined amount that the bit leak rate is reduced by is an exponential function.

9. The method of claim 8 wherein the exponential function is to reduce the bit leak rate by one-half for each received increment pointer adjustment signal or decrement pointer adjustment signal.

* * * * *

UNITED STATES PATENT AND TRADEMARK OFFICE
CERTIFICATE OF CORRECTION

PATENT NO. : 6,836,854 B2
DATED : December 28, 2004
INVENTOR(S) : Balaji Ranganath et al.

It is certified that error appears in the above-identified patent and that said Letters Patent is hereby corrected as shown below:

Column 6,
Line 62, "N/STM-N/STM-N" should read -- N/STM-N --.

Signed and Sealed this

Fifteenth Day of November, 2005

JON W. DUDAS
*Director of the United States Patent and Trademark Office*